(12) United States Patent
Mocuta et al.

(10) Patent No.: US 6,762,469 B2
(45) Date of Patent: Jul. 13, 2004

(54) HIGH PERFORMANCE CMOS DEVICE STRUCTURE WITH MID-GAP METAL GATE

(75) Inventors: Anda C. Mocuta, LaGrangeville, NY (US); Meikei Ieong, Wappingers Falls, NY (US); Ricky S. Amos, Rhinebeck, NY (US); Diane C. Boyd, LaGrangeville, NY (US); Dan M. Mocuta, LaGrangeville, NY (US); Huajie Chen, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/127,196

(22) Filed: Apr. 19, 2002

(65) Prior Publication Data

US 2003/0197230 A1 Oct. 23, 2003

(51) Int. Cl.$^7$ ............................................... H01L 29/76
(52) U.S. Cl. ................... 257/407; 257/391; 257/392; 257/376; 257/402; 257/204; 257/69; 257/327; 257/332; 438/217; 438/300; 438/197; 438/301; 438/303
(58) Field of Search .............................. 257/392, 376, 257/402, 204, 391, 407; 438/217

(56) References Cited

U.S. PATENT DOCUMENTS

| 5,952,701 A | | 9/1999 | Bulucea et al. |
| 5,960,270 A | | 9/1999 | Misra et al. |
| 6,043,139 A | * | 3/2000 | Eaglesham et al. ......... 438/495 |
| 6,091,122 A | | 7/2000 | Buchanan et al. |
| 6,143,593 A | | 11/2000 | Augusto |
| 6,180,978 B1 | | 1/2001 | Chatterjee et al. |
| 6,198,157 B1 | * | 3/2001 | Ishida et al. ................ 257/607 |
| 6,376,293 B1 | * | 4/2002 | Chapman .................... 438/199 |
| 6,376,318 B1 | * | 4/2002 | Lee et al. .................... 438/300 |
| 6,426,260 B1 | * | 7/2002 | Hshieh ....................... 438/270 |
| 2001/0009292 A1 | | 7/2001 | Nishinohara et al. |

FOREIGN PATENT DOCUMENTS

| EP | 0840362 | 5/1998 |
| JP | 11017182 | 1/1999 |
| JP | 2000183329 | 6/2000 |

* cited by examiner

*Primary Examiner*—Eddie Lee
*Assistant Examiner*—Junghwa Im
(74) *Attorney, Agent, or Firm*—Scully, Scott, Murphy & Presser; Joseph P. Abate, Esq.

(57) ABSTRACT

High performance (surface channel) CMOS devices with a mid-gap work function metal gate are disclosed wherein an epitaxial layer is used for a threshold voltage Vt adjust/decrease for the PFET area, for large Vt reductions (~500 mV), as are required by CMOS devices with a mid-gap metal gate. The present invention provides counter doping using an in situ B doped epitaxial layer or a B and C co-doped epitaxial layer, wherein the C co-doping provides an additional degree of freedom to reduce the diffusion of B (also during subsequent activation thermal cycles) to maintain a shallow B profile, which is critical to provide a surface channel CMOS device with a mid-gap metal gate while maintaining good short channel effects. The B diffusion profiles are satisfactorily shallow, sharp and have a high B concentration for devices with mid-gap metal gates, to provide and maintain a thin, highly doped B layer under the gate oxide.

5 Claims, 2 Drawing Sheets

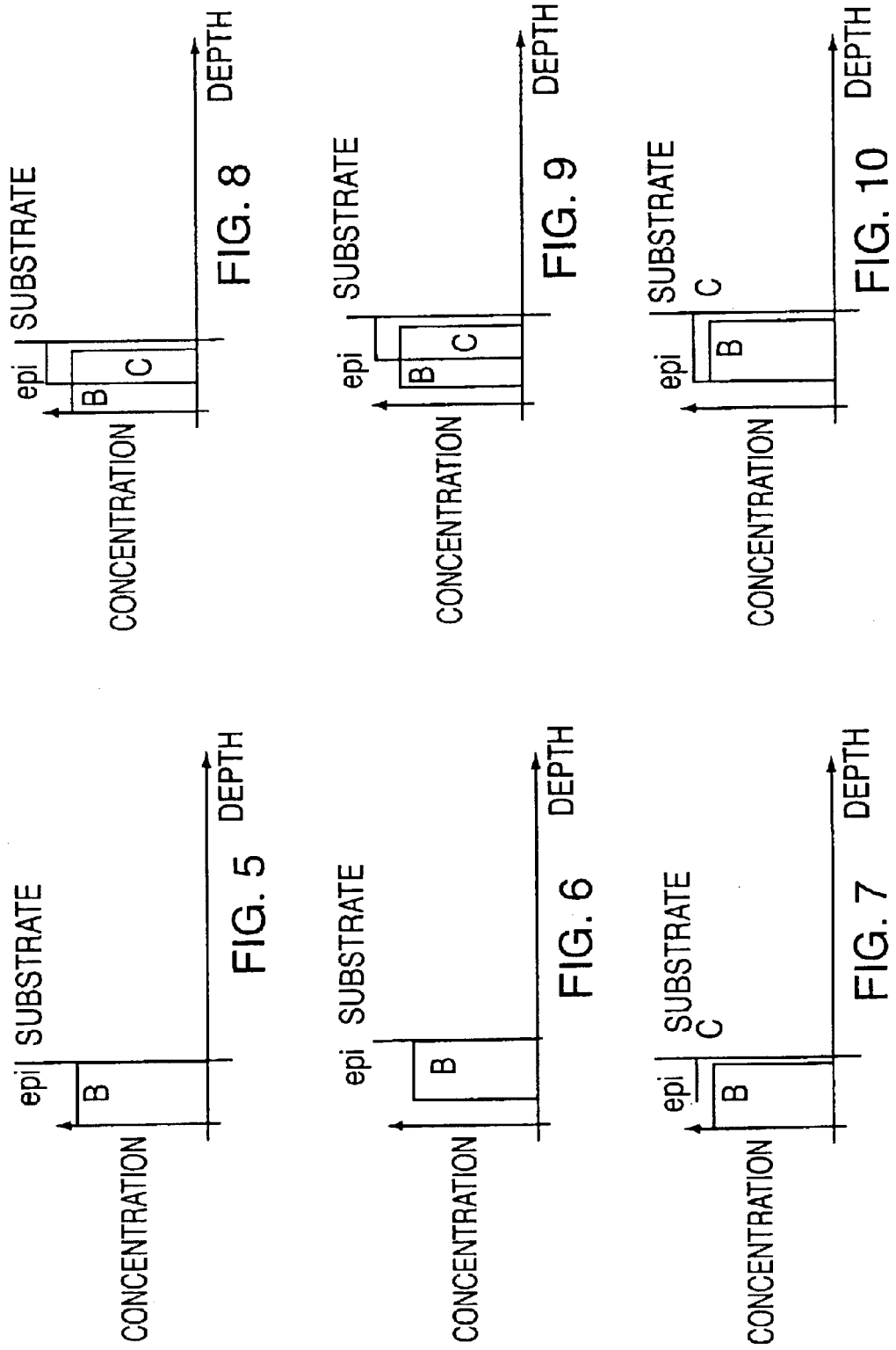

HIGH PERFORMANCE CMOS DEVICE STRUCTURE WITH MID-GAP METAL GATE

BACKGROUND OF THE INVENTION

1. Field of the Invention

The present invention relates generally to high performance CMOS device structures with a mid-gap metal gate, and more particularly pertains to high performance CMOS device structures with a mid-gap work function metal gate wherein an epitaxial layer is used for a threshold voltage Vt adjust/decrease for the PFET area, for large Vt reductions (~500 mV), as are required by CMOS devices with a mid-gap metal gate.

2. Discussion of the Prior Art

The problems and issues associated with the design of CMOS devices with a mid-gap work function metal gate are well known and recognized in the prior art (e.g. E. Josse and T. Skotnicki, IEDM 1999).

In the fabrication of high performance CMOS devices with ultra-thin gate dielectrics and polysilicon gates, the depletion layer formed in the polysilicon gate in inversion bias becomes a significant fraction of the gate capacitance and degrades the device performance.

The use of a metal gate in these CMOS devices alleviates this problem. Two different metals with appropriate workfunctions can be used, a first metal with a first workfuction for the PFET area and a second metal with a second workfunction for the NFET area. However, this approach adds significant cost and complexity to the process. Alternatively, the same metal can be used for the gate of both the PFET area and NFET area with a mid-gap workfunction. For CMOS mid-gap workfunction metal gates, the threshold voltage Vt for both the PFET area and the NFET area become unacceptably high. The threshold voltage has to be adjusted downwardly by adding p-type dopant to the surface of the PFET area and n-type dopant to the surface of the NEFT area.

SUMMARY OF THE INVENTION

The present invention provides high performance (surface channel) CMOS devices with a mid-gap work function metal gate, and is applicable to 0.1 um technology structures. Pursuant to the present invention, an epitaxial layer is used for a threshold voltage Vt adjust/decrease for the PFET area, for large Vt reductions (~500 mV), as are required by CMOS devices with a mid-gap metal gate. The present invention provides counter doping using an in situ boron (B) doped epitaxial layer or a B and carbon (C) co-doped epitaxial layer, wherein the C co-doping provides an additional degree of freedom to reduce the diffusion of B (also during subsequent activation thermal cycles) to maintain a shallow B profile, which is critical to provide a surface channel CMOS device with a mid-gap metal gate while maintaining good short channel effects. The present invention produces B diffusion profiles in an epitaxial layer of B doped silicon or B and C co-doped silicon on the PFET area of the CMOS devices. The B diffusion profiles are satisfactorily shallow, sharp and have a high B concentration for devices with mid-gap metal gates, to provide and maintain a thin, highly doped B layer under the gate oxide.

A further object of the subject invention is the provision of a method of fabricating mid-gap metal gate CMOS devices with good short channel effects wherein an epitaxial layer is used for a threshold voltage Vt adjust/decrease for the PFET area, for large Vt reductions (~500 mV), as are required by CMOS devices with a mid-gap metal gate.

BRIEF DESCRIPTION OF THE DRAWINGS

The foregoing objects and advantages of the present invention for a high performance CMOS device structure with a mid-gap metal gate may be more readily understood by one skilled in the art with reference being had to the following detailed description of several embodiments thereof, taken in conjunction with the accompanying drawings wherein like elements are designated by identical reference numerals throughout the several views, and in which:

FIGS. 5–10 illustrate several boron (B) and carbon (C) doping profiles in the epitaxial layer which can be used in case problems arise with mobility degradation or degraded gate dielectric reliability.

FIG. 5 illustrates a B doped epitaxial layer extending from the substrate to the surface of the structure.

FIG. 6 illustrates a B doped epitaxial layer on the substrate, followed by an undoped epitaxial surface layer extending from the B doped epitaxial layer to the surface.

FIG. 7 illustrates a C doped epitaxial layer on the substrate, followed by a B and C doped epitaxial layer spaced from the substrate and extending to the surface.

FIG. 8 illustrates a C doped epitaxial layer on the substrate, followed by a B and C doped epitaxial layer, followed by a B only doped layer to the surface.

FIG. 9 illustrates a C doped epitaxial layer on the substrate, followed by a B and C doped epitaxial layer, followed by a B only doped layer, followed by an undoped layer extending from the B only doped epitaxial layer to the surface.

FIG. 10 illustrates a C doped epitaxial layer on the substrate followed by a B and C doped epitaxial layer spaced from the substrate, followed by an undoped layer extending from the B and C doped epitaxial layer to the surface.

DETAILED DESCRIPTION OF THE INVENTION

The present invention provides a method for fabricating high performance CMOS devices with a mid-gap workfunction metal gate. The present invention uses the same metal with a mid-gap work function for the gate of both the PFET area and NFET area, and provides a device structure and fabrication method for CMOS devices with a mid-gap workfunction metal gate with an approximately 40 nm gate length.

For CMOS devices with a mid-gap workfunction metal gate, the threshold voltage Vt for both the PFET area and the NFET area become unacceptably high. The threshold voltage has to be adjusted downwardly by implanting a p-type dopant into the surface of the PFET area and an n-type dopant into the surface of the NEFT area. Ideally the dopant should be positioned right at the gate dielectric/silicon interface such that large shifts in the threshold voltage Vt are possible but short channel effects are not degraded. In practice this counter doping layer can have a finite thickness before short channel effects are degraded.

Process/device simulations have indicated that maintaining a junction depth of less than ~100 A can lead to acceptable short channel effects and effective adjustment of the threshold voltage Vt. Acceptable Vt adjust and short channel effects can be obtained with a shallow As compensating implant for the NFET area (n-type compensating doping) as it is known that As diffusion is relatively slow.

For the PFET area however (p-type compensating doping), the diffusion of B in Si is very fast, especially in the presence of excess interstitials created by ion implantation.

Pursuant to the present invention, the Vt adjust for the PFET area uses an in situ B doped epitaxial silicon layer or an in situ B and C co-doped epitaxial silicon layer.

This approach provides a number of advantages:
  the thermal cycle seen by this Vt adjust layer can be reduced (it is unnecessary to perform an activation anneal as the B is active as grown);
  there is no implant damage in the epitaxial layer to cause transient enhanced diffusion during subsequent thermal steps;
  in situ carbon co-doping can be used to further retard B diffusion. This solution can be applied in a self aligned conventional mid-gap workfunction metal gate flow as well as in a replacement gate type of flow; selective epitaxial doping as well as non-selective epitaxial doping can be used. An additional masking step is required to remove nonselective epi from an NFET sacrificial oxide area.

Figure 1:
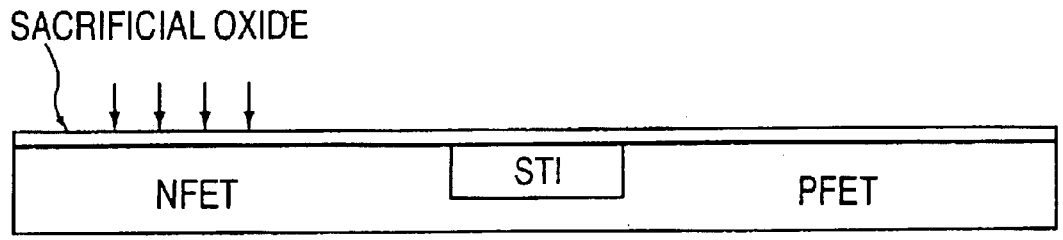
FIG. 1 illustrates a CMOS structure having an NFET area on the left and a PFET area on the right, separated by shallow trench isolation (STI) area with a sacrificial oxide layer over the entire CMOS structure, and also illustrates an n dopant As being implanted into the NFET area.
Figure 2:
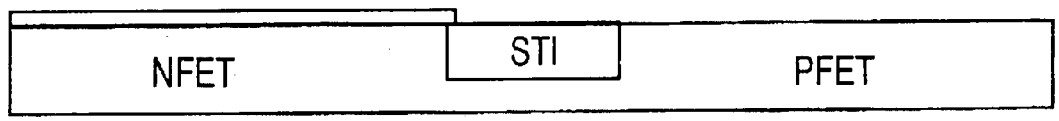
FIG. 2 illustrates a masked etch of the sacrificial oxide layer from over PFET area while the sacrificial oxide layer over the NFET area is preserved by a photoresist mask thereover to prevent etching thereof.
Figure 3:
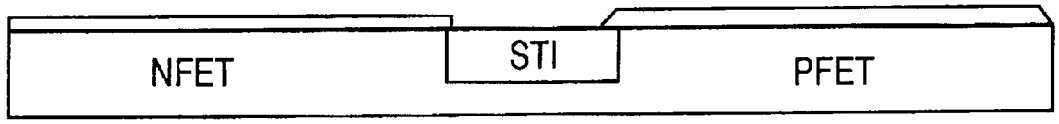
FIG. 3 illustrates a thin (<100A) selective epitaxial layer deposition over the PFET area.

FIGS. 1–3 show the process steps to achieve CMOS devices in one preferred embodiment of the present invention.

FIG. 1 illustrates a CMOS structure on a silicon substrate having an NFET area on the left and a PFET area on the right, separated by shallow trench isolation (STI) area, with a sacrificial oxide layer over the entire CMOS structure. The vertical arrows indicate a step of arsenic (AS) n-type doping implantation into the NFET area through the sacrificial oxide layer to adjust downwardly the threshold voltage Vt of the NFET area, which is followed by an anneal step.

FIG. 2 illustrates the CMOS structure after performing a masked etch of the sacrificial oxide layer from over the PFET area while the sacrificial oxide layer over the NFET area is preserved by a photoresist mask thereover to prevent etching thereof.

FIG. 3 illustrates the CMOS structure after the growth and deposition of a thin (<100A) selective epitaxial layer over the PFET area. The epitaxial layer is either in situ boron doped epitaxial silicon or in situ boron and carbon doped epitaxial silicon. If non-selective epitaxial deposition is used, after the non-selective epitaxial deposition covers the entire CMOS structure, another non-critical mask can be used to protect the epitaxial layer over the PFET area, while the epitaxial layer over the STI and NFET areas is removed by an etch.

After complete removal of the sacrificial oxide layer, the process can continue with gate dielectric growth/deposition, followed by a continuation of a conventional CMOS process with metal gate deposition and etch, spacers, extension, halo and deep S/D implants.

Figure 4:
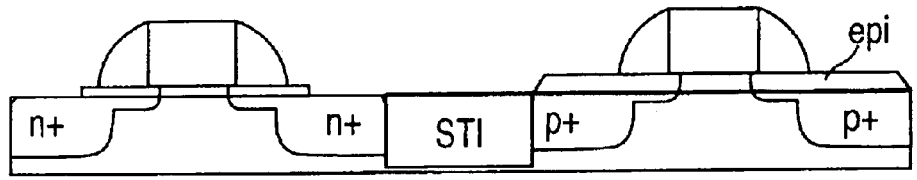
FIG. 4 illustrates an end product CMOS device with a mid-gap metal gate after a continuation of a conventional CMOS process with operations of gate oxide deposition, metal deposition and gate definition.

FIG. 4 illustrates an end product CMOS device with a mid-gap metal gate after a continuation of a conventional CMOS process with operations of gate oxide deposition, metal deposition and gate definition.

Figure 4A:
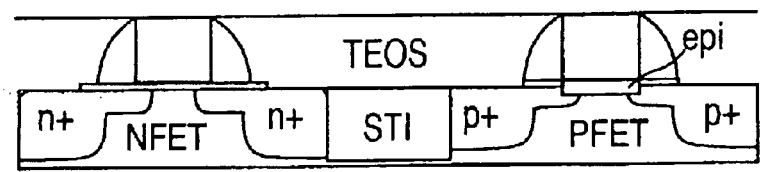
FIG. 4A illustrates an end product CMOS device with a mid-gap metal gate after a continuation of a conventional replacement gate process.

FIG. 4A illustrates an end product CMOS device with a mid-gap metal gate after a continuation of a conventional replacement gate process, including operations of source and drain implants and anneals, TEOS deposition and planarization, dummy gate removal, and selective sacrificial oxide removal on the PFET area only, all of which steps are well known in the art.

In a replacement gate type of flow the doped epitaxial layer can be grown either as illustrated in FIGS. 1–3, or after removal of the sacrificial gate and before the new gate dielectric is grown.

FIGS. 5–10 illustrate several boron (B) and carbon (C) doping profiles which can be used in the epitaxial layer in case problems arise with mobility degradation or degraded gate dielectric reliability.

FIGS. 5–10 illustrate graphs of dopant concentration of boron (B) and carbon (C) versus depth of the epitaxial layer on a Si substrate, wherein the surface of the PFET substrate prior to the epitaxial deposition is indicated by the vertical dotted line, and the surface of the structure after the epitaxial deposition is indicated by the vertical arrow to the left. The spacing between the arrow and the B dopant in FIGS. 6, 9 and 10 indicate a silicon epitaxial layer with no dopant therein. As is known in the art, the B dopant, C dopant, B and C dopants, and no dopants can be produced in an epitaxial growth chamber by selectively introducing appropriate gases, or not, into the chamber during the epitaxial growth process, to produce the dopant profiles shown in FIGS. 5–10. The concentration of B doping can typically be $2\times10^{19}/cm^2$, and the concentration of the C doping can typically be $1\times10^{20}/cm^{20}$.

FIG. 5 illustrates a B doped epitaxial layer extending from the substrate to the surface of the structure.

FIG. 6 illustrates a B doped epitaxial layer on the substrate, followed by an undoped epitaxial surface layer extending from the B doped epitaxial layer to the surface.

FIG. 7 illustrates a C doped epitaxial layer on the substrate, followed by a B and C doped epitaxial layer spaced from the substrate and extending to the surface.

FIG. 8 illustrates a C doped epitaxial layer on the substrate, followed by a B and C doped epitaxial layer, followed by a B only doped layer to the surface.

FIG. 9 illustrates a C doped epitaxial layer on the substrate, followed by a B and C doped epitaxial layer, followed by a B only doped layer, followed by an undoped layer extending from the B only doped epitaxial layer to the surface.

FIG. 10 illustrates a C doped epitaxial layer on the substrate followed by a B and C doped epitaxial layer spaced from the substrate, followed by an undoped layer extending from the B and C doped epitaxial layer to the surface.

The process of the present invention makes it possible to adjust Vt for the PFET area of a CMOS device with a mid-gap work function metal gate while not degrading short channel effects.

This device structure is considered for 11 s tungsten (W) gate devices.

While several embodiments and variations of the present invention for a high performance CMOS device structure with mid-gap metal gate are described in detail herein, it should be apparent that the disclosure and teachings of the present invention will suggest many alternative designs to those skilled in the art.

Having thus described our invention, what we claim as new and desire to secure by Letters Patent is:

1. A CMOS device with a mid-gap work function metal gate, comprising:

an NFET area and a PFET area separated by a shallow trench isolation area on a silicon substrate;

means for decreasing the threshold voltage Vt of the PFET area comprising a p doped epitaxial layer grown over the PFET area, wherein the epitaxial layer decreases the threshold voltage Vt of the PFET area;

wherein the p doped epitaxial layer comprises a boron and carbon co-doped silicon epitaxial layer, wherein the carbon co-doping reduces the diffusion of boron, also during subsequent activation thermal cycles, to maintain a shallow boron doping profile, which provides a CMOS device with a mid-gap metal gate while maintaining good short channel effects;

wherein the p doped epitaxial layer comprises a boron doped silicon epitaxial layer on the silicon substrate, followed by an undoped epitaxial surface layer extending from the boron doped silicon epitaxial layer to the surface of the device.

2. A CMOS device with a mid-gap work function metal gate, comprising:

an NFET area and a PFET area separated by a shallow trench isolation area on a silicon substrate;

means for decreasing the threshold voltage Vt of the PFET area comprising a p doped epitaxial layer grown over the PFET area, wherein the epitaxial layer decreases the threshold voltage Vt of the PFET area;

wherein the p doped epitaxial layer comprises a boron and carbon co-doped silicon epitaxial layer, wherein the carbon co-doping reduces the diffusion of boron, also during subsequent activation thermal cycles, to maintain a shallow boron doping profile, which provides a CMOS device with a mid-gap metal gate while maintaining good short channel effects;

wherein the p doped epitaxial layer comprises a carbon doped silicon epitaxial layer on the silicon substrate, followed by a boron and carbon doped silicon epitaxial layer spaced from the substrate and extending to the surface of the device.

3. A CMOS device with a mid-gap work function metal gate, comprising:

an NFET area and a PFET area separated by a shallow trench isolation area on a silicon substrate;

means for decreasing the threshold voltage Vt of the PFET area comprising a p doped epitaxial layer grown over the PFET area, wherein the epitaxial layer decreases the threshold voltage Vt of the PFET area;

wherein the p doped epitaxial layer comprises a boron and carbon co-doped silicon epitaxial layer, wherein the carbon co-doping reduces the diffusion of boron, also during subsequent activation thermal cycles, to maintain a shallow boron doping profile, which provides a CMOS device with a mid-gap metal gate while maintaining good short channel effects;

wherein the p doped epitaxial layer comprises a carbon doped silicon epitaxial layer on the silicon substrate, followed by a boron and carbon doped silicon epitaxial layer spaced from the silicon substrate, followed by a boron only doped layer to the surface of the device.

4. A CMOS device with a mid-gap work function metal gate, comprising:

an NFET area and a PFET area separated by a shallow trench isolation area on a silicon substrate;

means for decreasing the threshold voltage Vt of the PFET area comprising a p doped epitaxial layer grown over the PFET area, wherein the epitaxial layer decreases the threshold voltage Vt of the PFET area;

wherein the p doped epitaxial layer comprises a boron and carbon co-doped silicon epitaxial layer, wherein the carbon co-doping reduces the diffusion of boron, also during subsequent activation thermal cycles, to maintain a shallow boron doping profile, which provides a CMOS device with a mid-gap metal gate while maintaining good short channel effects;

wherein the p doped epitaxial layer comprises a carbon doped silicon epitaxial layer on the silicon substrate, followed by a boron only doped silicon epitaxial layer, followed by an undoped silicon layer extending from the boron only doped silicon epitaxial layer to the surface of the device.

5. A CMOS device with a mid-gap work function metal gate, comprising:

an NFET area and a PFET area separated by a shallow trench isolation area on a silicon substrate;

means for decreasing the threshold voltage Vt of the PFET area comprising a p doped epitaxial layer grown over the PFET area, wherein the epitaxial layer decreases the threshold voltage Vt of the PFET area;

wherein the p doped epitaxial layer comprises a boron and carbon co-doped silicon epitaxial layer, wherein the carbon co-doping reduces the diffusion of boron, also during subsequent activation thermal cycles, to maintain a shallow boron doping profile, which provides a CMOS device with a mid-gap metal gate while maintaining good short channel effects;

wherein the p doped silicon epitaxial layer comprises a carbon doped silicon epitaxial layer on the silicon substrate, followed by a boron and carbon doped silicon epitaxial layer spaced from the silicon substrate, followed by an undoped silicon layer extending from the boron and carbon doped silicon epitaxial layer to the surface of the device.

* * * * *